United States Patent [19]
Reed et al.

[11] Patent Number: 4,781,775
[45] Date of Patent: Nov. 1, 1988

[54] COPLANAR DIE TO SUBSTRATE BOND METHOD

[75] Inventors: David J. Reed, Mesa; Robert K. Fairbanks, Phoenix, both of Ariz.

[73] Assignee: Motorola Inc., Schaumburg, Ill.

[21] Appl. No.: 56,497

[22] Filed: Jun. 1, 1987

[51] Int. Cl.$^4$ .............................................. B32B 31/06
[52] U.S. Cl. ..................... 156/89; 156/293; 29/740; 174/52 FP; 357/74; 357/80
[58] Field of Search ........................ 156/87, 89, 293; 357/74, 80, 81; 174/52 FP; 29/740

[56] References Cited

U.S. PATENT DOCUMENTS

| | | | |
|---|---|---|---|
| 4,300,978 | 11/1981 | Whitemore et al. | 156/87 |
| 4,620,216 | 10/1986 | Horvath | 357/81 |
| 4,630,096 | 12/1986 | Drye et al. | 357/74 |

Primary Examiner—Caleb Weston
Attorney, Agent, or Firm—Harry A. Wolin

[57] ABSTRACT

A coplanar die to substrate bond method wherein a plurality of die are aligned on a silicon wafer substrate in a predetermined relationship and a slurry of glass is applied to bond them together. This occurs while either on a flat or a grooved plate. When the silicon wafer substrate and the plurality of die are ready for firing, they are placed on a grooved plate so that grooves are below the glass thereby decreasing the capillary force which commonly causes overflow. With reduced overflow, the bonding can be done at a higher temperature to reduce underflow. Because there is no underflow or overflow using this process, a greater degree of coplanarity is achieved thereby making future processing steps, such as the processing of interconnect lines, much easier to perform.

14 Claims, 1 Drawing Sheet

COPLANAR DIE TO SUBSTRATE BOND METHOD

BACKGROUND OF THE INVENTION

This invention generally pertains to a coplanar die to substrate bond method. Generally, in high density integrated circuit module assemblies and the like, it is desirable to have a coplanar relationship between the plurality of die and the substrate in which the die are mounted so that future processing steps, such as the processing of interconnect lines, may be performed with relative ease. U.S. Pat. No. 4,630,096 entitled "High Density IC Module Assembly", which was issued on Dec. 16, 1986 is the type of module in which the present invention will be used.

Previous die to substrate bond methods have met difficulty in that there is a lack of coplanarity between the die and the substrate. The die are generally bonded to the substrate using a fritted glass slurry. Perhaps the most common problem occurs during the firing of the glass after it has been applied to the die and substrate. While the glass is being fired, it is common that either overflow or underflow will result. This causes a lack of coplanarity between the substrate and the die. This lack of coplanarity creates shorting as well as opens in interconnect lines and step coverage problems due to improper amounts of metal interconnect being disposed in the existing groove. Therefore, a coplanar die to substrate bonding method, which allows easier interconnect line processing steps is highly desirable.

SUMMARY OF THE INVENTION

The present invention pertains to a coplanar die to substrate bond method wherein a plurality of die are disposed in die openings of a silicon wafer substrate. Once the die are disposed and aligned properly in the silicon wafer substrate, a slurry of glass is applied between the sidewalls of the die openings and the edges of the die. This occurs while the silicon wafer substrate and the die are on either a flat vacuum plate or a grooved vacuum plate. After the glass slurry is applied and at least partially dried, the die and silicon wafer substrate will be placed on a grooved vacuum plate for firing if the glass slurry was applied on a flat plate and if the glass slurry was applied on a grooved plate, it could remain on it for firing. On the grooved vacuum plate, the silicon wafer substrate and the die are aligned so that the spaces between them wherein the glass slurry is applied are disposed over a groove on the grooved vacuum plate. This allows less chance for capillary action during firing thereby reducing the propensity for overflow. The silicon wafer substrate including the plurality of die bonded thereto is then fired on the grooved plate allowing the glass frit to fuse. Because of the reduced propensity for overflow, the substrate can be fired at a higher temperature which reduces underflow.

The purpose of the grooved plate is to maintain planarity by giving support to the plurality of die as well as the substrate during the firing process, while eliminating any tight spaces which can act as capillaries that will draw the molten glass out of the substrate and onto the plurality of die. In some cases the surface tension of the molten glass will maintain the plurality of die and the substrate surfaces coplanar so that supporting only the substrate to eliminate the tight spaces that can form capillaries is all that is needed. In that case, supporting the substrate with three spacers around the edge would be one solution.

It is an object of the present invention to provide a new and improved coplanar die to substrate bond method.

It is a further object of the present invention to provide a new and improved coplanar die to substrate bond method which will enable further processing steps to be performed more easily.

It is a further object of the present invention to provide a new and improved coplanar die to substrate bond method which enables a high density integrated circuit module assembly to be cheaply and easily manufactured.

It is a further object of the present invention to provide a new and improved coplanar die to substrate bond method utilizing a grooved plate thereby reducing capillary forces which cause overflow and allow the bond to be made at a higher temperature to reduce underflow.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
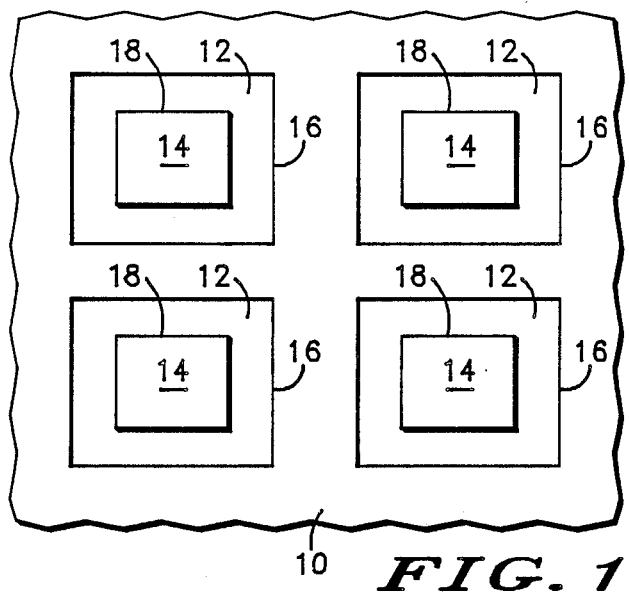
FIG. 1 is a highly enlarged top view of a section of a silicon wafer substrate including die openings with a plurality of die incorporated therein.

Referring specifically to FIG. 1, a highly enlarged top view of a section of a silicon wafer substrate, 10, having a plurality of die openings, 12, with a plurality of die, 14, incorporated therein is shown. Each of the plurality of die openings 12 has a plurality of sidewalls, 16. Further, each member of plurality of die 14 includes a plurality of edges, 18. In order to dispose and align plurality of die 14 in die openings 12 of silicon wafer substrate 10, plurality of die 14 must first be put on a plate, 20, (see FIG. 2) in a predetermined relationship to each other. Plate 20 is a flat plate as shown however, a grooved plate, 22, (see FIG. 3) may also be used. Both grooved plate 22 and plate 20 are commonly vacuum plates and include a plurality of vacuum holes, 34, however, it should be understood that this is not required. Once plurality of die 14 are placed on either plate 20 or grooved plate 22, silicon wafer substrate 10 is disposed and aligned on either plate 20 or grooved plate 22 with plurality of die 14 so that plurality of die are disposed in die openings 12 of silicon wafer substrate 10.

Figure 2:
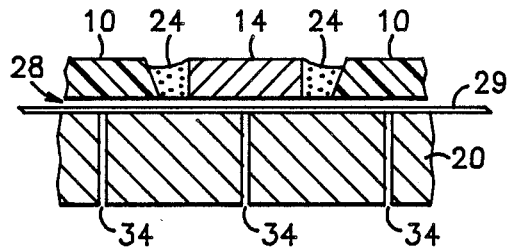
FIG. 2 is an enlarged cross-sectional view of the silicon wafer substrate of FIG. 1 on a flat plate.
Figure 3:
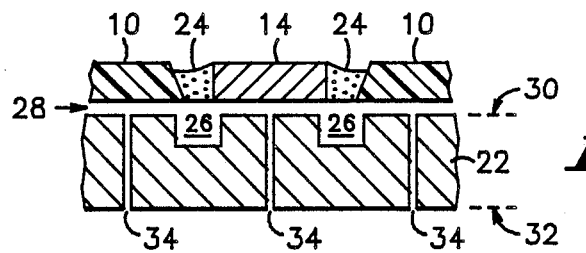
FIG. 3 is an enlarged cross-sectional view of the silicon wafer substrate of FIG. 1 on a grooved plate embodying the present invention.

Referring specifically to FIG. 2 and FIG. 3, highly enlarged cross-sectional views of silicon wafer substrate 10 including a member of plurality of die 14 are shown on plate 20 and grooved plate 22, respectively. Once silicon wafer substrate 10 and plurality of die 14 are disposed and aligned properly upon either plate 20 or grooved plate 22, a slurry of glass, 24, is applied between sidewalls 16 of die openings 12 of silicon wafer substrate 10 and edges 18 of plurality of die 14 to bond plurality of die 14 to silicon wafer substrate 10. Special care should be taken or silicon wafer substrate 10 and plurality of die 14 should be cleaned so that after the application of glass 24, no excess glass remains on the surface of either silicon wafer substrate 10 or plurality of die 14. If slurry of glass 24 was applied to silicon wafer substrate 10 and plurality of die 14 while on plate 20, it should be moved to and disposed upon grooved plate 22 following the application and at least partial drying of glass 24. A thin film, 29, may be placed on plate 20 to aid in the removal of silicon wafer substrate 10 and plurality of die 14. Film 29 may be of a material such as MYLAR which is manufactured by the Dupont Company. If the previously mentioned steps were performed on grooved plate 22 initially, silicon wafer substrate 10 and plurality of die 14 along with slurry of glass 24 could remain thereon.

Silicon wafer substrate 10 and plurality of die 14 including glass 24 should be arranged on grooved plate 22 so that the areas where glass 24 bonds silicon wafer substrate 10 and plurality of die 14 together, are disposed directly over plurality of grooves, 26, which are cut into a first surface, 30, of grooved plate 22. A second surface, 32, of grooved plate 22 faces the opposite direction of first surface 30 and has no grooves. Once this arrangement is completed, the glass is fired until it becomes fused.

Figure 4:
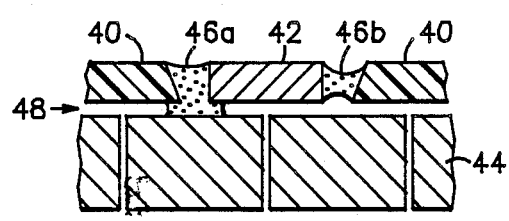
FIG. 4 is an enlarged cross-sectional view of a silicon wafer substrate on a flat plate as used in the prior art.

As shown in FIG. 4, a highly enlarged cross-sectional view of a silicon wafer substrate, 40, including a member of a plurality of die, 42, is positioned on a plate 44. Glass, 46, between substrate 40 and die 42 may have problems with either overflow (46a) during firing if fired on plate 44. This is due to a capillary force which builds up in an area, 48, which lies between plate 44 and silicon wafer substrate 40 including plurality of die 42. This capillary force in area 48 causes overflow (46a) depending upon the temperature at which the glass is fired, the size of the opening between substrate 40 and die 42, and the amount of glass 46 in the opening. If the firing temperature is not high enough, insufficient flow of glass 46 results in underflow (46b). Often, both overflow (46a) and underflow (46b) will occur on the same substrate depending upon the amount of glass 46 applied between plurality of die 42 and silicon wafer substrate 40. These areas of underflow (see 46b) and overflow (see 46a) cause future processing steps such as the processing of interconnect lines to become exceedingly difficult. Referring back to FIG. 3, when grooves 26 of grooved plate 22 are disposed beneath glass 24, the capillary force is much weaker than it would be without grooves 26 and therefore does not affect glass 24 as substantially. Groove 26 must be large enough so that the surface tension of glass 24 does not allow glass 46 to come in contact with grooved plate 22. Additionally the steps of applying a slurry of glass 24 and firing may be repeated so that underflow problems may be corrected in firing. Performing more than one firing step at different temperatures will allow for a more controlled firing process. For example, a first firing at 400° C. will cause glass 24 to shrink and have a limited flow while a second firing after the addition of more glass 24 at 470° C. will cause glass 24 to flow completely and create a better bond between silicon wafer substrate 10 and plurality of die 14.

Plate 20 and grooved plate 22 should be made of a material such as boron nitrite. When plate 20 or grooved plate 22 is made of a material such as stainless steel, glass 24, when applied in slurry form, tends to wet either plate 20 or grooved plate 22 thereby causing a greater capillary force in an area, 28, during firing. Since boron nitrite does not wet to the extent that stainless steel does, a much lesser capillary force is created. Additionally, boron nitrite has a relatively rough surface which allows silicon wafer substrate 10 and plurality of die 14 to be held on either plate 20 or grooved plate 22 much more easily. Also, since boron nitrite is relatively soft, it is easy to machine and as a result, plate 20 and grooved plate 22 are made with relative ease.

Plate 22 and grooved plate 20, as mentioned previously, may be vacuum plates including vacuum holes 34 but they do not have to be. It should be understood that the vacuum serves only to hold silicon wafer substrate 10 and plurality of die 14 in place. The vacuum has no properties for curing glass 24. Grooved plate 22 may be a vacuum plate throughout or it may have no vacuum in grooves 26. By having no vacuum in grooves 26, there is less chance of a capillary force overcoming the surface tension of glass 24 and drawing glass onto grooved plate 22 and causing overflow.

Thus, it is apparent that there has been provided, in accordance with the invention, an improved coplanar die to substrate bond method which meets the objects and advantages set forth above by reducing the propensity for underflow and overflow of glass during firing. While we have shown and described specific embodiments of this invention, further modifications and improvements will occur to those skilled in the art. We desire to be understood, therefore, that this invention is not limited to the particular form shown and we intend in the appended claims to cover all modifications which do not depart from the spirit and the scope of this invention.

What is claimed is:

1. A coplanar die to substrate bond method for multichip modules and the like comprising the steps of:

providing a silicon wafer substrate having die openings incorporated therein, each of said die openings having a plurality of sidewalls;

providing a plurality of die to be disposed in said die openings of said silicon wafer substrate, each of said plurality of die having a plurality of edges;

placing said plurality of die on a plate in a predetermined relationship to each other;

disposing and aligning said silicon wafer substrate on said plate with said die so that said plurality of die are disposed in said die openings of said silicon wafer substrate;

applying a slurry of glass between said plurality of sidewalls of said die openings of said silicon wafer substrate and said edges of said plurality of die while still on said plate, said slurry of glass being at least partially dried to hold said plurality of die and said silicon wafer substrate together;

placing said silicon wafer substrate including said plurality of die held thereto by said glass on a grooved plate having a plurality of grooves, said grooves being aligned with said sidewalls of said die openings of said silicon wafer substrate, said edges of said plurality of die and said glass therebetween; and firing said silicon wafer substrate, said plurality of die and said glass while on said grooved plate until said glass becomes fused.

2. The method of claim 1 wherein the placing said plurality of die on a plate step includes placing said plurality of die on a vacuum plate.

3. The method of claim 1 wherein the placing said plurality of die on a plate step includes placing said plurality of die on a boron nitrite plate.

4. The method of claim 1 wherein the placing said silicon wafer substrate on a grooved plate step includes placing said silicon wafer substrate on a grooved vacuum plate.

5. The method of claim 4 wherein the placing said silicon wafer substrate on a grooved vacuum plate step includes placing said silicon wafer substrate on a grooved vacuum plate having no vacuum in the grooves themselves.

6. The method of claim 1 wherein the placing said silicon wafer substrate on a grooved plate step includes placing said silicon wafer substrate on a boron nitrite grooved plate.

7. The method of claim 1 wherein the applying a slurry of glass, placing said silicon wafer substrate on a grooved plate and firing steps are repeated a predetermined number of times.

8. The method of claim 7 wherein subsequent firing steps may be performed at higher temperatures than previous firing steps.

9. A coplanar die to substrate bond method for multichip modules and the like comprising the steps of:
   providing a silicon wafer substrate having die openings incorporated therein, each of said die openings having a plurality of sidewalls;
   providing a plurality of die to be disposed in said die openings of said silicon wafer substrate, each of said plurality of die having a plurality of edges;
   placing said plurality of die in a predetermined position on a grooved plate having a plurality of grooves;
   disposing and aligning said silicon wafer substrate on said grooved plate with said plurality of die so that said plurality of die are disposed in said die openings of said silicon wafer substrate, said plurality of grooves of said grooved plate being aligned with said sidewalls of said die openings of said silicon wafer substrate and said edges of said plurality of die;
   applying a slurry of glass between said plurality of sidewalls of said plurality of die openings of said silicon wafer substrate and said edges of said plurality of die while still on said grooved plate; and
   firing said silicon wafer substrate, said plurality of die and said glass on said grooved plate until said glass becomes fused.

10. The method of claim 9 wherein the placing said plurality of die on a grooved plate step includes placing said plurality of die on a grooved vacuum plate.

11. The method of claim 10 wherein the placing said plurality of die on a grooved vacuum plate step includes placing said plurality of die on a grooved vacuum plate having no vacuum in the grooves themselves.

12. The method of claim 9 wherein the placing said plurality of die on a grooved plate step includes placing said plurality of die on a boron nitrite grooved plate.

13. The method of claim 9 wherein the applying a slurry of glass and firing steps are repeated a predetermined number of times.

14. The method of claim 13 wherein subsequent firing steps may be performed at higher temperatures than previous firing steps.

* * * * *